United States Patent
Sherman

[19]

[11] Patent Number: 6,141,203
[45] Date of Patent: Oct. 31, 2000

[54] ELECTROSTATIC CHUCK

[76] Inventor: Arthur Sherman, 600 Sharon Park Dr., C-307, Menlo Park, Calif. 94025

[21] Appl. No.: 08/965,867

[22] Filed: Nov. 7, 1997

Related U.S. Application Data

[63] Continuation-in-part of application No. 08/617,948, Mar. 15, 1996, Pat. No. 5,867,359, which is a continuation-in-part of application No. 08/205,923, Mar. 3, 1994, Pat. No. 5,535,090.

[51] Int. Cl.$^7$ ................................................. H02N 13/00
[52] U.S. Cl. ........................................... 361/234; 279/128
[58] Field of Search ..................................... 361/230, 233, 361/234, 235; 269/8, 903; 279/128

[56] References Cited

U.S. PATENT DOCUMENTS

5,535,090   7/1996   Sherman ................................. 361/234

*Primary Examiner*—Fritz Fleming
*Attorney, Agent, or Firm*—Robert Moll; @ Patent Planet

[57] ABSTRACT

An electrostatic chuck is provided having a plurality of small electrostatic structures for holding an electrically conductive workpiece forming a plate of a capacitor. Each electrostatic structure includes a first thermally conductive single-crystal dielectric sheet, and a first electrode in sheet form sandwiched between the first dielectric sheet and a second dielectric surface. The workpiece, typically a conductive or semiconductive wafer, is juxtaposed to the first dielectric sheet of each electrostatic structure and forms a second electrode. The second dielectric sheet, if thick, is used as a thermally conducting base plate which can be attached to a low pressure reactor. If the second dielectric is a thin sheet, then it is mounted to a thermally conductive metal base plate through which heat can be controllably conducted. The resultant electrostatic structure may be brazed to the metal base plate if the thermal expansion characteristics of the two elements are sufficiently matched. The first thermally conductive dielectric sheet is preferably formed of sapphire ($Al_2O_3$), which is sufficiently thermally conductive to allow for rapid heat transfer between the base plate and the workpiece. The first electrodes of different electrostatic structures are held at different electrical potentials (typically of several thousand volts difference) and a charge is maintained by this potential difference between selected electrostatic structures.

5 Claims, 13 Drawing Sheets

Section A-A

Section A-A

ELECTROSTATIC CHUCK

The present application is a continuation-in-part application of U.S. application Ser. No. 08/617,948, filed on Mar. 15, 1996, now U.S. Pat. No. 5,867,359, which is a continuation-in-part patent application of U.S. Pat. No. 5,535,090, filed on Mar. 3, 1994, as U.S. application Ser. No. 08,205,923. The present application claims priority to and incorporates by reference the entire disclosures of U.S. application Ser. No. 08/617,948 and U.S. Pat. No. 5,535,090.

BACKGROUND OF THE INVENTION

A. Field of Invention

The present invention pertains to an electrostatic chuck used to hold conducting or semiconducting wafers (such as silicon wafers) in a low pressure or vacuum environment, so that they may be easily cooled or heated. In particular, the present invention relates to the arrangement of high quality materials used, the method of fabrication of a chuck and techniques for operation of a chuck according to the invention.

B. Description of Related Art

There are a number of semiconductor fabrication processes that have to be carried out in a low pressure environment (below one torr). Two that require wafer cooling are ion implantation and reactive ion etching. In both of these processes, poor thermal coupling exists between the chuck and wafer due to lack of thermal conduction through a gas between them. The ion bombardment that occurs in both implantation and etching leads to a high energy flux into the face of the wafer, and the wafer may overheat unless the heat can be removed by heat transfer to the chuck holding it. Using a cooled chuck will not solve the problem unless some way is found to improve the thermal coupling between the wafer and the chuck. A well-known way to do this is to hold the wafer with a clamp ring and add backside gas.

Other processes normally require wafer heating, rather than cooling. In this category are sputtering and most low pressure chemical vapor deposition processes. Again clamping and backside gas can be used to enhance the thermal coupling. In general, a wafer ring clamp is undesirable because a clamp covers part of the wafer surface. A preferred solution is to hold the wafer with electrostatic forces firmly enough to allow better thermal coupling for improved thermal transfer. This would avoid any need to touch the front of the wafer. In addition, the chuck should be fabricated from high temperature conductors and dielectrics to allow use at high temperature. The original concept for an electrostatic chuck was described by G. Wardly, "Electrostatic Wafer Chuck for Electron Beam Microfabrication," Rev. Sci. Instr. 44, 1506 (1973). The wafer acting as one plate of a capacitor was placed on a metal chuck covered with a dielectric. The metal chuck was then held at one electric potential, and the wafer was held at a different potential by contacting either its front or back surface. As is well known, there is a strong attractive force between the two plates of a capacitor when they are held at different potentials. Such an electrostatic chuck is referred to as monopolar. Many further developments have been reported in the patent literature. Approaches similar to Wardly's were described in Livesay (U.S. Pat. No. 3,983,401, Sep. 28, 1976) and McGinty (U.S. Pat. No. 3,993,509, Nov. 23, 1976).

Because the voltage is applied between the wafer and the electrode, electrical contact with the wafer is required. This requirement limits the wafers to be held to be conductors or semiconductors or to be coated with a conducting layer. For example, a silicon wafer coated with a layer of oxide ($SiO_2$) cannot be held by a monopolar chuck. After Wardly's publication, Wachtler (U.S. Pat. No. 3,916,270, Oct. 28, 1975), Briglia (U.S. Pat. No. 4,184,188, Jan. 15, 1980) and Wicker (U.S. Pat. No. 4,724,510, Feb. 9, 1988) recognized that it was not necessary to contact the wafer if a split electrode concept is used, i.e., when the lower electrode of a capacitor is split into two equal parts and separated by an insulator, with each half placed at equal but opposite voltages (+V and −V), then the upper electrode (the wafer) must be at ground potential (V=0) because of symmetry. In this case, there is a potential difference between each half of the lower electrode and its respective portion of the upper electrode (the wafer) of V. The attractive force between two plates of a capacitor depends on the voltage difference squared, so there are equal holding forces on each wafer half. Most importantly, it is not necessary to touch the wafer surface in order to maintain the voltage at the wafer at a selected (preferably zero) potential relative to ground. Such electrostatic chucks are referred to as bipolar.

Wachtler, Briglia and Wicker all described an "interdigitated" bipolar arrangement that is fairly difficult to fabricate. A simpler arrangement was described by Abe (U.S. Pat. No. 4,384,918 May 24, 1983), wherein each electrode is a simple half circle. Fabricating such a bipolar chuck presents many practical difficulties. The force of attraction is very sensitive to flatness of the chuck surface, and it is difficult to electrically isolate each half electrode. A further refinement on the bipolar concept was described in Suzuki (U.S. Pat. No. 4,692,836, Sep. 8, 1987). He pointed out that by using a radially segmented bipolar design, a wafer that is initially bowed up in the center can be more easily flattened by activating the central electrodes first. Unfortunately, practical semiconductor wafers are more likely to be warped (somewhat like a potato chip) rather than simply bowed. The Suzuki design offers no solution to this problem.

Even though an electrostatic chuck can hold a wafer in a low pressure reactor, there may still be difficulty in transferring heat into or out of the wafer. When the gas pressure between the wafer and the chuck is less than 10 torr, there is very little heat conduction through the gas, so heat has to be transferred by radiation and conduction through the few points of solid-to-solid contact. Experience has shown that a 500° C. chuck temperature will produce a 400° C. wafer temperature in a low pressure environment. This will not allow adequate control for critical semiconductor processes. Lewin (U.S. Pat. No. 4,502,094, Feb. 26, 1985) suggested the use of thermally conducting spacers between the conducting grid lines of an interdigitated bipolar design. Logan (U.S. Pat. No. 5,055,964 Oct. 8, 1991) described an aluminum chuck coated with aluminum oxide. The problem with both of these approaches is undesirably high solid-to-solid thermal contact resistance at low pressures. Moreover, the invention of Logan is limited to temperatures below 450° C. because of its aluminum construction. Tezuka (U.S. Pat. No. 4,771,730, Sep. 20, 1988) proposed a solution to the problem of chuck-to-wafer heat transfer by introducing backside gas. However, consideration was limited to an aluminum electrode with aluminum oxide coating or a plastic dielectric. In either case, the chuck cannot be used for high temperature operation (e.g., greater than 450° C.). Ward (U.S. Pat. No. 4,665,463, May 12, 1987) solves the contact problem just described by using a plastic dielectric loaded with a thermally conducting powder. This approach relies on the improved thermal contact between a compliant plastic and the hard wafer surface. However, a plastic dielectric cannot be used for high temperature applications (e.g., greater than 200° C.). In addition, Ward notes that his device has a retention characteristic. That is, after a wafer has been held, it cannot be released for as long as 24 hours. Such wafer retention, even for times much less than 24 hours, poses obvious difficulties in practical reactor operation.

The problem of wafer retention or sticking was dealt with in Horowitz (W088/0905), where an AC chuck was described. When a DC voltage is applied, the dielectric separating the wafer and the metal chuck can become permanently polarized and, after the voltage is removed, the residual polarization can hold a wafer for some time, as noted above. Horowitz suggested the use of sapphire or boron nitride as the dielectric material because of their ability to transfer RF power efficiently. However, he did not describe any method of fabricating such a chuck. In particular, when two pieces of a single crystal material are joined by a high temperature process, it is important to know whether or not the crystalline material is anisotropic. In other words, when heated, it may expand different amounts in different crystal orientations. In this case, when the joined parts cool to room temperature, the assembly warps. It should be noted that large diameter discs or wafers of sapphire or boron nitride as required by the Horowitz technique are prohibitively expensive. At the same time, AC excitation of an electrostatic chuck introduces many practical difficulties in designing and operating such a system.

Another approach to dealing with the problem of slow wafer release is described in U.S. Pat. No. 5,117,121, May 26, 1992. Watanabe describes a chuck made of ceramic that is inherently susceptible to retention forces. He proposed solving the problem by applying a high voltage reverse bias (1.5×–2×) when release is desired. This high voltage increases the risk of breakdown of the dielectric and, in addition, is hard to control in a practical circuit. For example, if the reverse bias is held too long, the wafer will stick again and will not release. Accordingly, there is a need for a more practical, more reliable and less expensive mechanism for holding and reliably releasing wafers in a vacuum environment.

SUMMARY OF THE INVENTION

According to the invention, an electrostatic chuck is provided having a plurality of small electrostatic structures for holding an electrically conductive workpiece. Each electrostatic structure includes a first thermally conductive single-crystal dielectric sheet, a second thermally conductive dielectric sheet, and a metal electrode in sheet form sandwiched between the first and second dielectric sheets. The first electrodes of different electrostatic structures are held at different electrical potentials (typically of several thousand volts difference) and a charge is maintained by this potential difference between selected electrostatic structures, as well as between the electrostatic structures and the electrically conductive workpiece. A CVD layer-by-layer coating technique is used to coat the assembled chuck with a dielectric coating.

The workpiece, typically a conductive or semiconductive wafer, is juxtaposed to the first dielectric sheet of each electrostatic structure and forms a second electrode. The second dielectric sheet, if thin, is mounted to a thermally conductive metal base plate through which heat can be controllably conducted. This base plate forms a portion of the vacuum chamber wall of the low pressure reactor. The second dielectric sheet, if sufficiently thick, will withstand a pressure difference of one atmosphere, and can be used directly as the thermally conductive base plate, obviating the need for a separate metal base plate. The first thermally conductive single crystal dielectric sheets are preferably formed of sapphire (single crystal $Al_2O_3$), which is sufficiently thermally conductive to allow for rapid heat transfer between the base plate and the workpiece.

The first electrode is preferably formed of niobium. The first electrode, the first dielectric sheet, and the second dielectric sheet (thick or thin) of each electrostatic structure are preferably brazed together using a brazing alloy. When the second dielectric sheet is thin, the resultant electrostatic structure may optionally be brazed to a metal base plate if the thermal expansion characteristics of the two elements are sufficiently matched. Two bonding methods may be employed. In one, the dielectrics and metal are bonded by a vacuum brazing process using suitable high temperature braze alloys. A second approach is to sputter coat both dielectric parts with platinum, use a thin sheet of platinum as the metallic part, and bond the three together with a conducting platinum ink that can be fired in air at high temperature.

Since sapphire can be an anisotropic material, depending on how it is cut, if both the upper and lower dielectrics are sapphire, it is important the two pieces to be joined are the same crystal orientation. For example, the most commonly available thin sapphire sheets are "R" and "A" plane material, and they are both anisotropic. In order to successfully join two pieces of either material, in a high temperature process, it is necessary to assure that each piece has the same orientation. If "C" plane material is used, this restriction is not important, since this orientation of sapphire is isotropic in the plane of the thin crystal.

An alternative more cost effective approach is to use a thicker piece of high purity alumina as the second dielectric. Because of its greater thickness and rigidity, there will be less tendency for the assembly to warp after fabrication, as the braze will be strong enough to hold the parts together and have them remain flat. This approach will work best for lower temperature applications, where the thermal stresses due to thermal expansion coefficient mismatches between the different materials are lower. After fabrication of the small capacitors and their assembly into the larger chuck structure, one additional process step is used to ensure that all sapphire surfaces are continuous. In general, it is possible to grow $Al_2O_3$ by chemical vapor deposition (CVD) techniques at moderate subrefractory temperatures (approximately 600° C.), and this method could be used to coat the assembled chuck. However, with traditional CVD techniques, it is generally difficult to achieve very conformal coatings. In the present design, it is important that the $Al_2O_3$ coat within some very narrow passages in order to prevent electrical discharges between the multiple electrodes, and also to prevent any escape of braze alloy vapor (i.e., Cu and Ag) into the reactor. Where trace quantities of such braze alloy materials can be very detrimental to the integrated circuits being manufactured, a CVD-related process has been discovered which can be used to coat the chuck with perfect conformality. G. S. Higashi and C. G. Fleming, 55 Appl. Phys. Lett. 1963 (1989), describe a technique under the title "Sequential Surface Chemical Reaction Limited Growth of High Quality $Al_2O_3$ Dielectrics." However, Higashi, et al., failed to appreciate the fact that the process could be adapted to coat interior surfaces. According to the invention, the film is grown one monolayer at a time, so that a coating is applied to all surfaces to which the gases can diffuse, uniformly and conformally, including interior surfaces within narrow passages.

After the chuck is treated by this technique, the top surface is made very flat by known ceramic grinding or lapping techniques. At the same time, the top dielectric is thinned in order to reduce the voltage needed to achieve the desired holding force. Operation of the chuck, with its several segments, can be carried out such that different segments can be energized depending on the degree of distortion of the wafer to be held. By this technique, it is possible to firmly clamp "realistically" warped wafers with a minimum of high voltage applied, thereby minimizing the risk of damage to any circuits on the wafer. Recognizing that none of the known approaches allows the operation of an electrostatic chuck with high-purity single-crystal dielectric at high temperature, one object of the present invention is to provide an electrostatic chuck fabricated out of high temperature single crystal dielectric, that can be used to process wafers at any temperature including elevated values. Suitable materials could be metals with melting points above that of aluminum, and refractory insulators (either single crystal or amorphous) as the dielectric. A second object is to provide such a chuck with a surface formed of moderate-sized pieces of high-quality single-crystal dielectrics (i.e., sapphire) to permit an inexpensive design. A further object is to provide a high temperature chuck that maintains high purity in an ultra high vacuum reactor. Another object is to provide an electrostatic chuck such that it can more easily flatten a wafer that is initially warped without maintaining a voltage difference between the wafer and the electrode, which could cause arcing. An advantage is that a single crystal dielectric does not exhibit permanent polarization so that a high temperature chuck is not limited by the "sticking" phenomena.

The present invention permits reliable wafer temperature measurement with an infrared transparent window through which a pyrometer may observe the rear of a held wafer. The invention also permits use of a backside gas, if needed to more closely thermally couple the wafer and chuck. The invention will be better understood from a consideration of the drawings and ensuing description.

DESCRIPTION OF PREFERRED EMBODIMENTS

Figure 1:
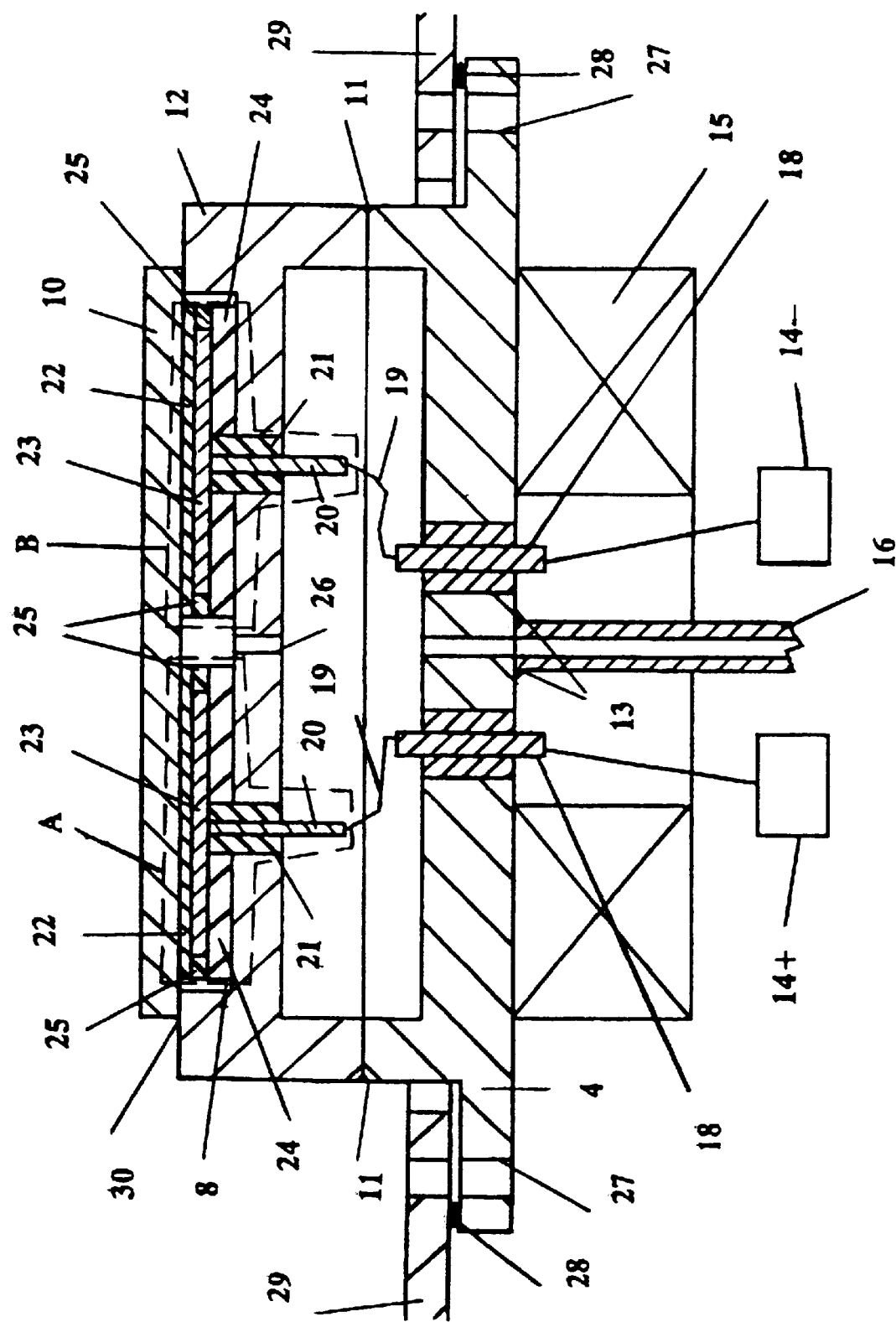
FIG. 1 is a cross-sectional side view of one form of an electrostatic chuck (constructed in accordance with the present invention.
Figure 3:
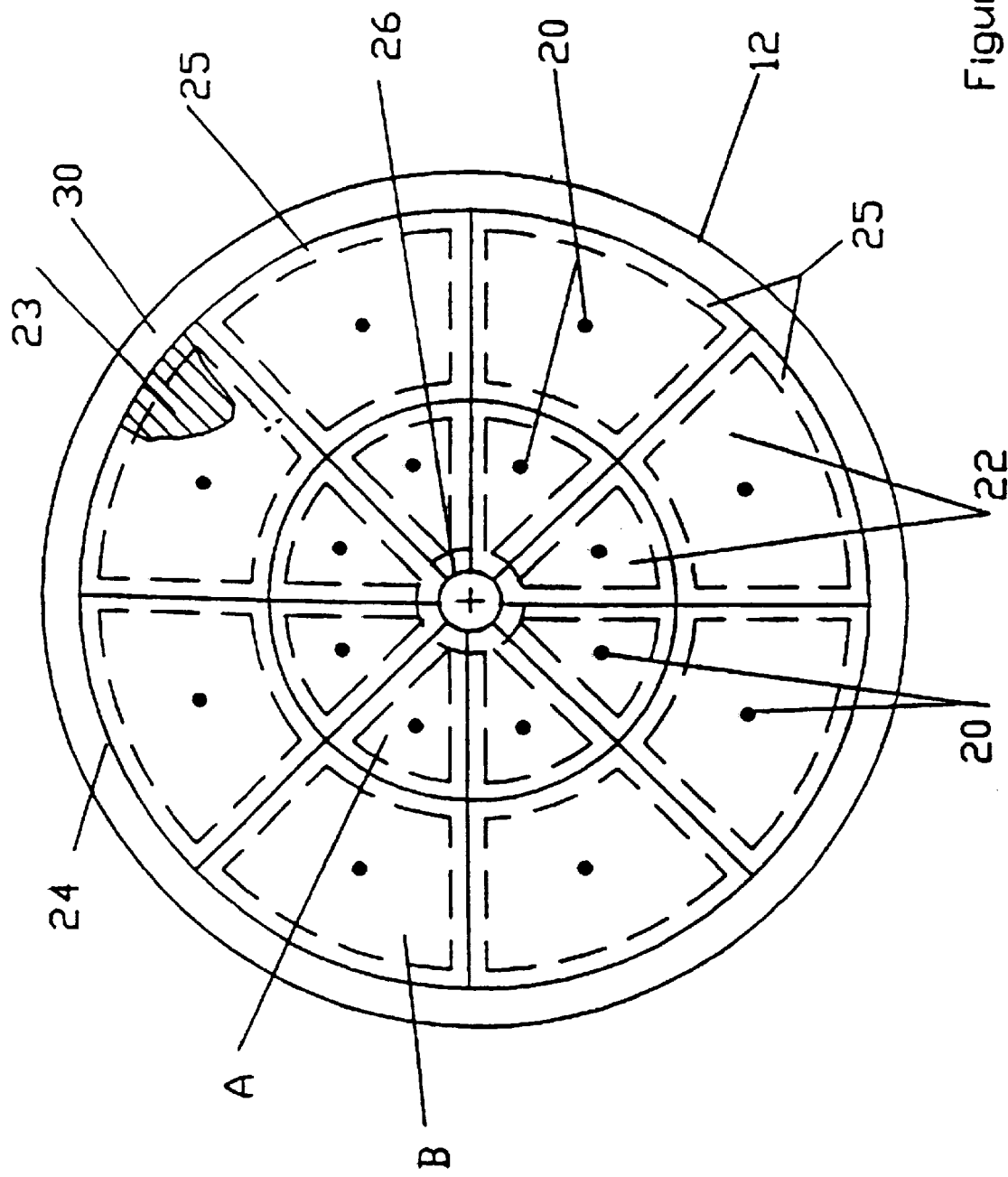
FIG. 3 is a plan view of either form of electrostatic chuck constructed in accordance with the present invention.

FIG. 1 shows an electrostatic chuck 8 in a metal housing 12, mounted on a reactor chamber wall 29. The chuck 8 has multiple small electrode segments as illustrated in FIGS. 3 and 4. The chuck segments A, B, comprise two thin ceramic plates 22 (the upper plate) and 24 (the lower plate) of suitable refractory dielectric. These two ceramic plates 22 and 24 are separated by, and attached to, a chuck element metal plate 23. Each metal plate 23 has a metal stud 20 attached, so that it can be placed at whatever potential is required, without regard to other chuck elements. Each stud 20 is electrically isolated from the chuck metal base 12 by a dielectric isolator sleeve 21. Each metal plate 23 is further electrically isolated from its environment by the ceramic separators 25, which also serve as a mechanical spacer as hereinafter explained. The chuck metal base 12 is made of a suitable metal and has a circular opening 26 drilled at its center and has a smooth (preferably flat) sealing surface 30. The base opening 26 can be used either to allow backside gas to reach the area between the semiconducting wafer 10 being held and the chuck segments A, B, or to allow observation of the backside of the wafer 10 by a pyrometer (not shown). The metal base is made vacuum tight by welding 11 a metal plate 4 onto it. The metal base 12 and plate 4 can in turn can be bolted 27 to a reactor 29 with a vacuum-tight gasket 28. Attached to the center of the lower surface of the metal base 4 is a heater/cooler assembly 15 used either to heat the base 12 to a high temperature or cool it, depending on whether the objective is to heat or cool the wafer 10. The metal base 4 has multiple vacuum-tight electrical feedthroughs 18, each connected to either a positive high voltage 14+ or a negative high voltage 14− power supply so that it can, in turn, be applied to the electrodes 23 of the electrostatic chuck. In addition, there may be a gas inlet or backside gas port 16 welded 13 into the base 4 that can be used to introduce low pressure gas between the wafer and the chuck surface. The pressure in this region has to be kept low (approximately equal to 10–20 torr), because this is a pressure high enough to give good thermal contact, while not introducing excessive gas leakage into the reactor chamber through the wafer/chuck sealing surface 30. For those applications where backside gas is undesirable, the backside gas port 16 will be replaced with an optical window transparent to infrared. In this case, observation of the back surface of the wafer 10 being held will allow an accurate determination of its temperature.

The conventional mode of operation of an electrostatic chuck 8 involves placing a wafer 10 (FIG. 1) on its surface and then applying a voltage or voltages to the entire upper dielectric surface at one time. Such a procedure is appropriate when the wafer being held is ideally perfectly flat. In reality semiconductor wafers are generally warped in irregular surface contours, especially after many high temperature processing steps. With the present design, it is possible to activate selectively any pair of chuck segments A, B serving as electrodes in whatever sequence is deemed appropriate to force a wafer into a flat contour on the chuck 8. Since the wafer surface is one plate of a capacitor structure, it is possible to electrically sense the local capacitance and thereby measure the gap between the wafer and the top surface of the chuck. In other words, the wafer surface shape can be mapped automatically using the electrodes as sensors as soon as a wafer is placed on the chuck according to the invention. Knowing which portions of the wafer are at the greatest separation from the chuck surface, those chuck elements can thereupon be activated selectively to initially flatten the most distorted part of the wafer first. As soon as the wafer is flattened, all of the electrode segments are thereafter activated, the potential on the initially-activated electrodes can be reduced and the entire wafer secured to the chuck surface. By this technique, an initially warped wafer is held with only the potential needed for a normally flat wafer. If the wafer were only able to be held with one uniform voltage, there would be excessive potential at the parts of the wafer that were already in contact with the chuck surface. The initial points of contact of a wafer with the chuck are candidates for undesired voltage breakdown, which could damage the wafer and the chuck.

Figure 2:
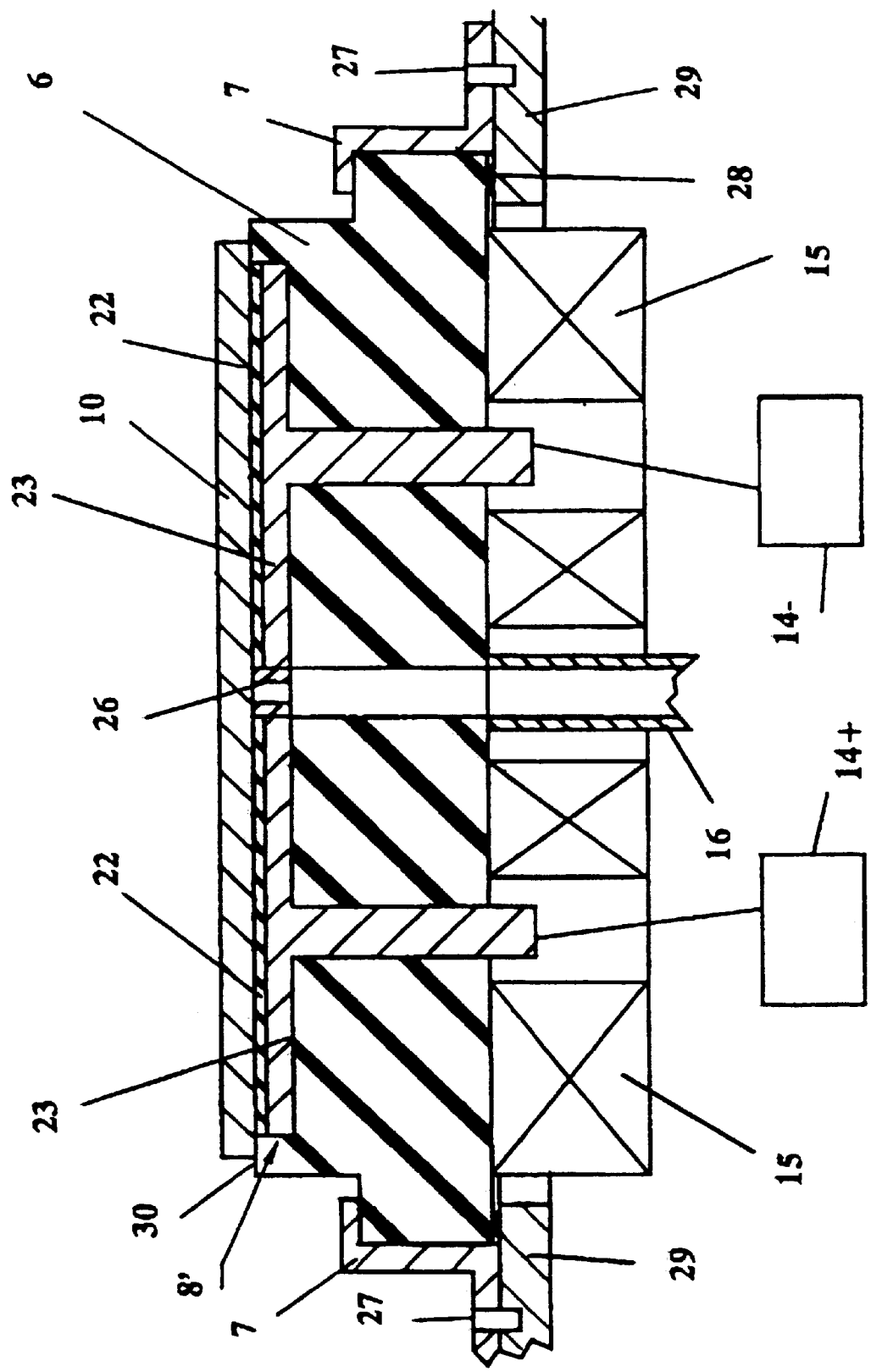
FIG. 2 is a cross-sectional side view of a second form of an electrostatic chuck constructed in accordance with the present invention.

FIG. 2 is a side view of a second alternative electrostatic chuck design showing metal plate/stud combinations 23 attached with a vacuum tight process (i.e., brazing) to a monolithic ceramic base 6. A thin ceramic plate 22 is placed over the electrode 23 to complete the electrostatic chuck. Pulling the wafer 10 flat against this ceramic surface provides a reasonable, but generally imperfect, substantially smooth gas seal at the supporting surface 30. Backside gas is introduced through a hole 26 from a tube 16 that also has to be brazed to the ceramic base. In this design, the heater/cooler 15 is attached to the backside of the large ceramic part 6, and it is secured to the reactor wall 29 with clamps 7 and bolts 27 and vacuum integrity is established by using either a metal or elastomer "O" ring 28. As before, high voltage is applied to each electrode 23 with power supplies 14– and 14+.

FIG. 3, a plan view of the electrostatic chuck of FIGS. 1 and 2, shows how the several small chuck segments A, B fit together to make the necessary large circular holding surface. Segments type A form an inner ring and segments type B form an outer ring. Any interlocking shape may be used. After assembly, the connecting studs 20 are preferably set at alternating polarities of equal potential (or at least at different potentials). In this way, each segment is surrounded by other segments of opposite polarity establishing a form of a bipolar chuck. The details of how, an individual segment is assembled are shown in FIGS. 4A–4D. It should be noted that, although parts 24 and 25 are shown as separate pieces, they may be fabricated out of a single piece of dielectric.

One of many difficulties in fabricating a large diameter electrostatic chuck out of high-quality single crystal dielectric (such as sapphire), is the expense of such material. For example, recent prices have suggested that a 100 mm diameter sapphire wafer of 0.6 mm thickness costs about $100, while a comparable 150 mm diameter wafer costs $800. Larger wafers are even more costly and of limited availability. By employing, instead, small dielectric segments reassembled into a shape comparable to a large diameter workpiece, inexpensive and readily available wafers can be employed to fabricate the chuck.

In FIG. 3, the ceramic separators 25 are placed to isolate the different metal plates 23 from one another. As noted earlier regarding the anisotropic nature of sapphire, if both dielectric plates are sapphire, then they should be either matched pieces of "R" or "A" plane anisotropic material or pieces of "C" plane isotropic material.

Figure 4A:
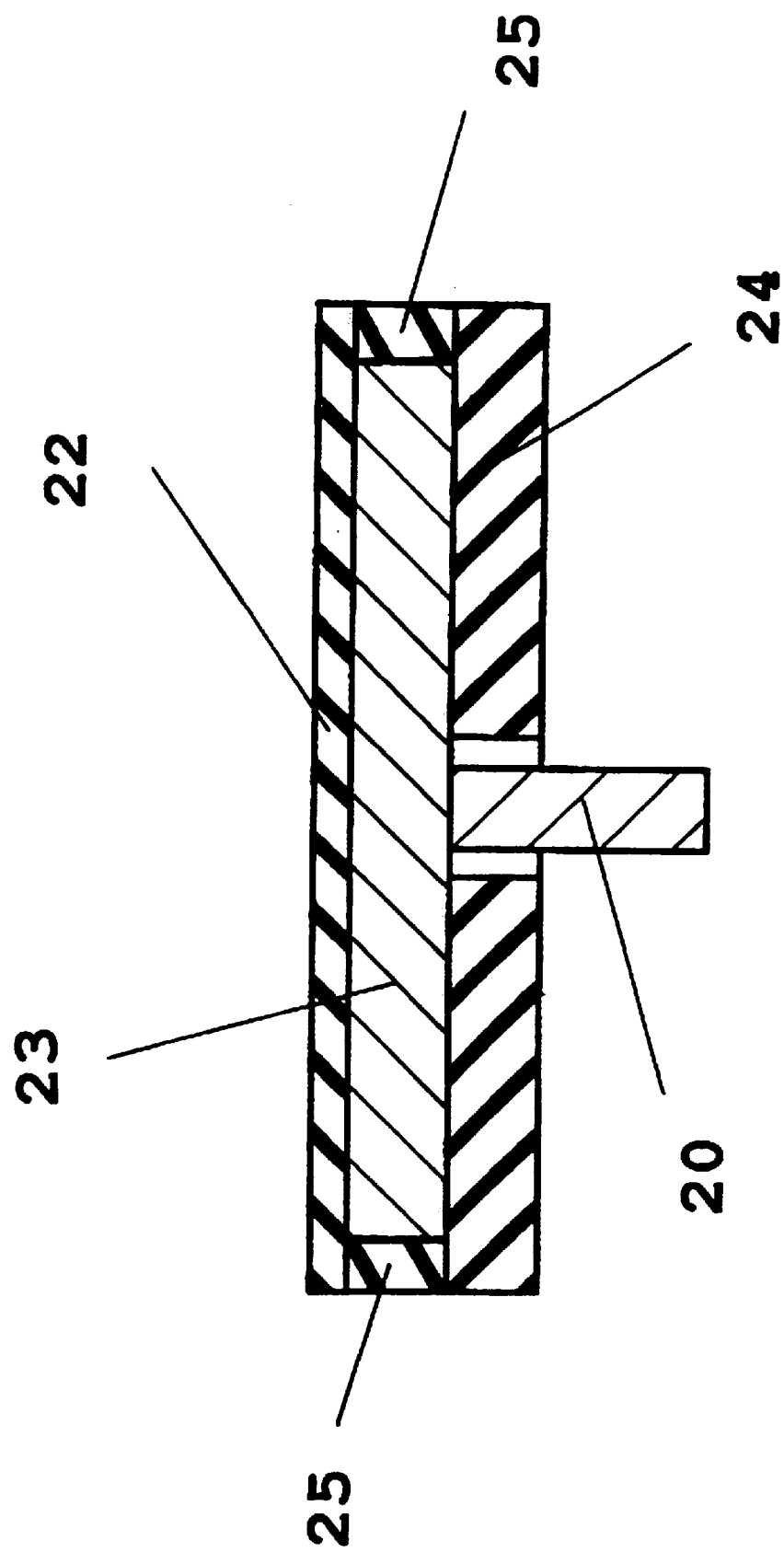
FIG. 4A is a side view showing the details of the chuck element construction for the electrostatic chuck described in FIG. 1.
Figure 4D:
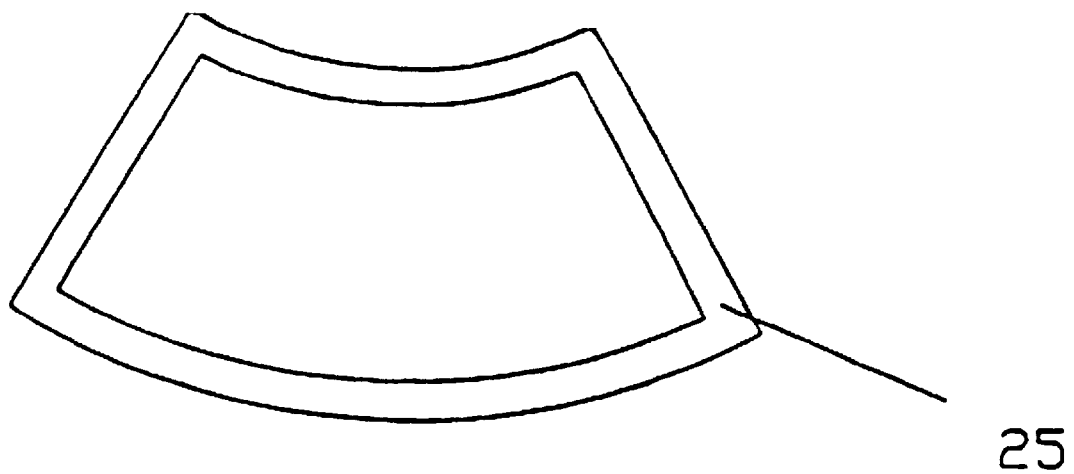
FIGS. 4B, 4C, and 4D are plan views of the individual parts of the chuck element.
Figure 4C:
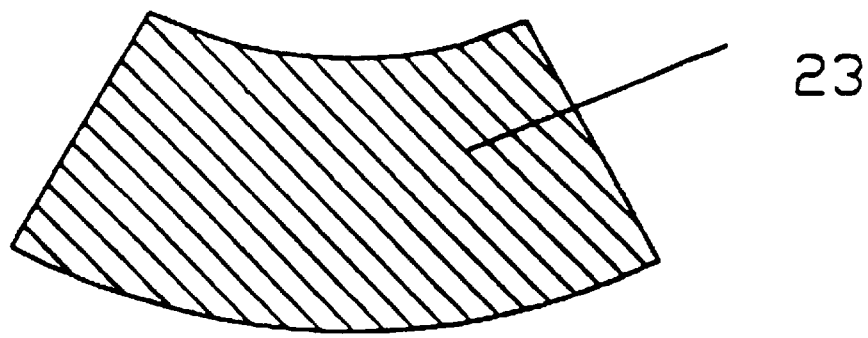
Figure 4B:
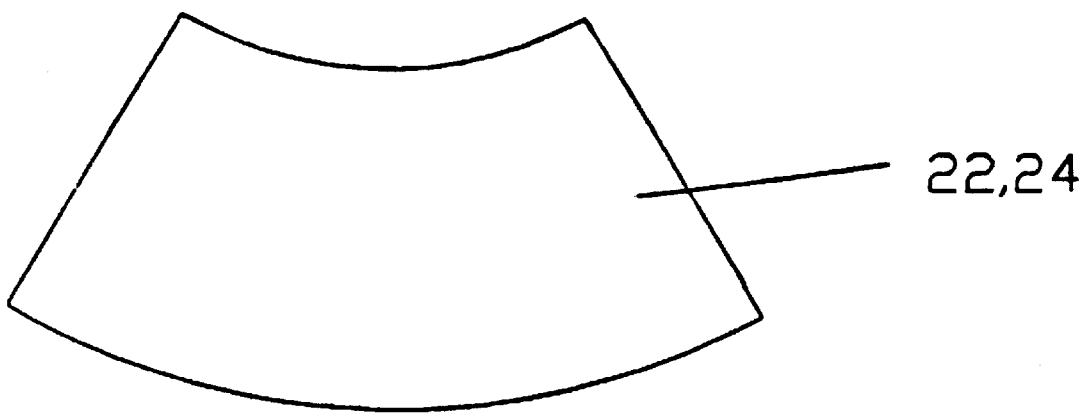

The major difficulty in fabricating the electrode assembly, as shown in FIG. 4A, lies in differences in thermal expansion between metal and dielectric when carrying out high temperature joining techniques, such as vacuum brazing. The preferred materials for the present construction are niobium and sapphire, since they have very similar thermal expansion coefficients. Titanium and its alloys may also be used with sapphire, and Kovar may be used with quartz.

There are two approaches to assembling the thin top ceramic plate 22, the chuck element metal plate 23 and the bottom ceramic plate 24. In the preferred embodiment, the elements are brazed together in a single-step, high temperature vacuum braze using a suitable active braze alloy, such as WESCO CUSIN-1-ABA to attach sapphire to niobium. The braze is accomplished at 840° C. A second approach is to use conventional commercially-available platinum paste. This approach was described in Yoshimura and Bowen, "Electrical Breakdown Strength of Alumina at High Temperature," Journal of the American Ceramic Society, Vol. 64, p. 404 (1981). In this case, platinum is initially sputtered onto the sapphire parts to promote adhesion. After a thin layer of platinum paste is spread on the sapphire parts, the sapphire and niobium are assembled and fired in air at a temperature of about 900° C.

Another difficulty in assembling this electrostatic chuck is making sure that the top of the chuck elements are flush with the sealing surface 30. At the same time, we want to assure that the thickness of the thin top ceramic plate is maintained accurately at some appropriately small value, such as 0.010 inches. Both objectives can be accomplished by machining the chuck metal base 12 of FIG. 1, or grinding the ceramic base 6 of FIG. 2, in such a way that the recess below the sealing surface 30 is precisely equal to the sum of the thicknesses of the bottom ceramic plate 24 plus the chuck element metal plate 23 plus 0.010 inches. Then the chuck elements are assembled with overly-thick top ceramic plates 22. After assembly, the ceramic top surface is ground down to the level of the sealing surface 30, leaving an accurate flat 0.010 inches thick top ceramic plate 22 that is flush with the sealing surface 30.

Figure 5:
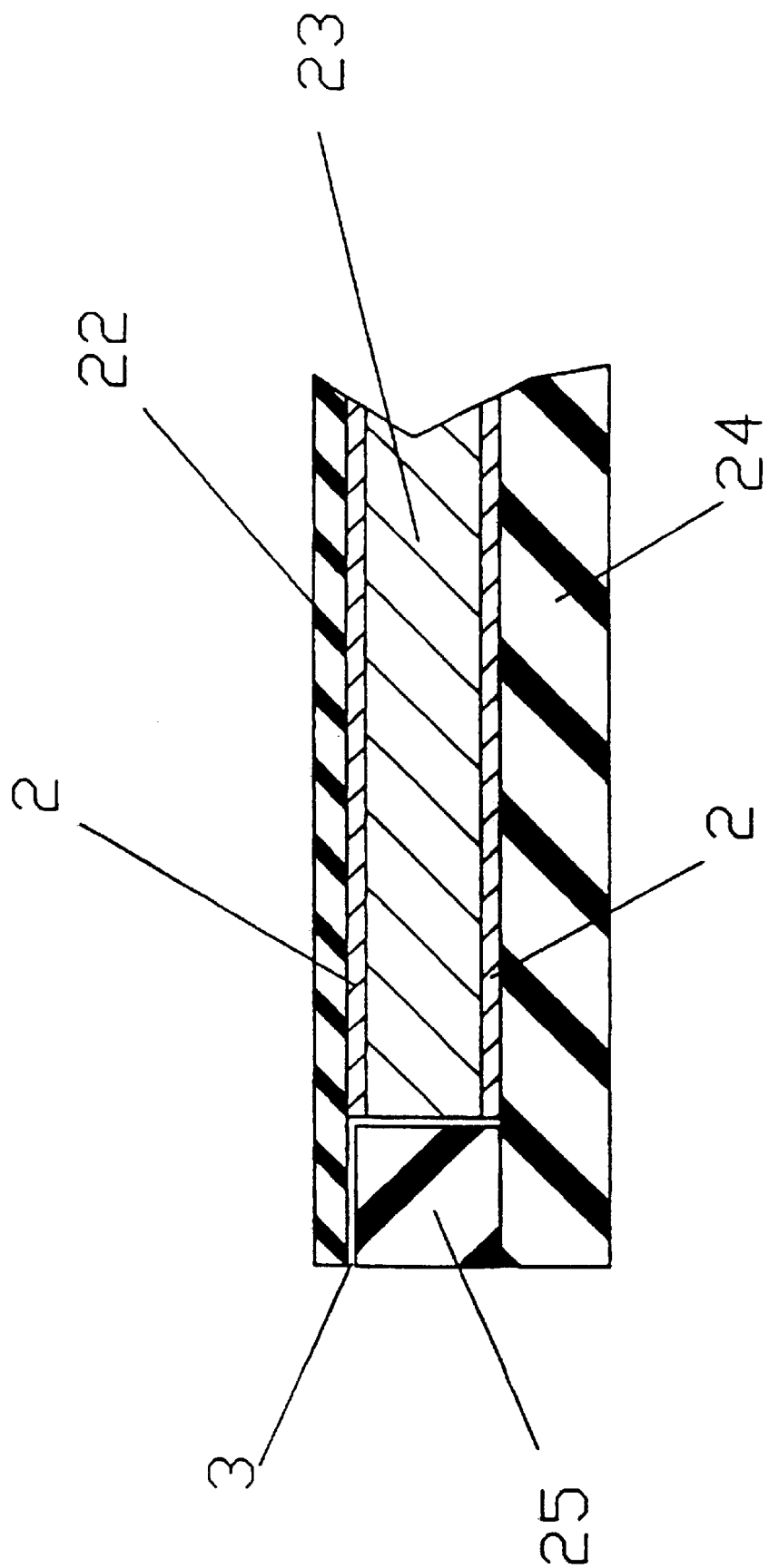
FIG. 5 is a detailed view of the fabrication gaps between dielectric parts of the chuck element construction.

The final difficulty in fabricating an electrostatic chuck suitable for use in high temperature and ultra high vacuum reactors is preventing any vapor (no matter how little) from the braze alloy 2 as shown in FIG. 5, typically silver or copper, from appearing in the reactor chamber. After the two ceramic plates and 24 are brazed to the metal plate 23 with spacer 25, there may still be a gap open 3 for braze alloy vapor to escape into the reactor. Since it will be impossible to achieve a vacuum tight fit between elements 25 and elements 22, 24, one way to prevent such deleterious exposure would be to coat the electrostatic chuck with $Al_2O_3$ by chemical vapor deposition techniques. For some situations this may be adequate. However, such deposition techniques are notorious for not coating intricate crevices uniformly. Therefore, a sequential surface chemical reaction deposition technique is used, as described for example by Higashi, et al., to very uniformly coat with dielectric in extremely thin layers and thereby seal any spaces that may communicate between the braze alloy and the chamber interior.

The design of the electrostatic chuck outlined above has been fabricated and operated successfully in a vacuum chamber at 500° C. A holding force of 20 torr at an applied DC voltage of +1000 V and –1000 V between adjacent chuck segments was observed. Such a holding force is sufficient to allow a 5–10 torr backside gas, and thereby provide excellent thermal accommodation between the wafer and the chuck surface.

Figure 6:
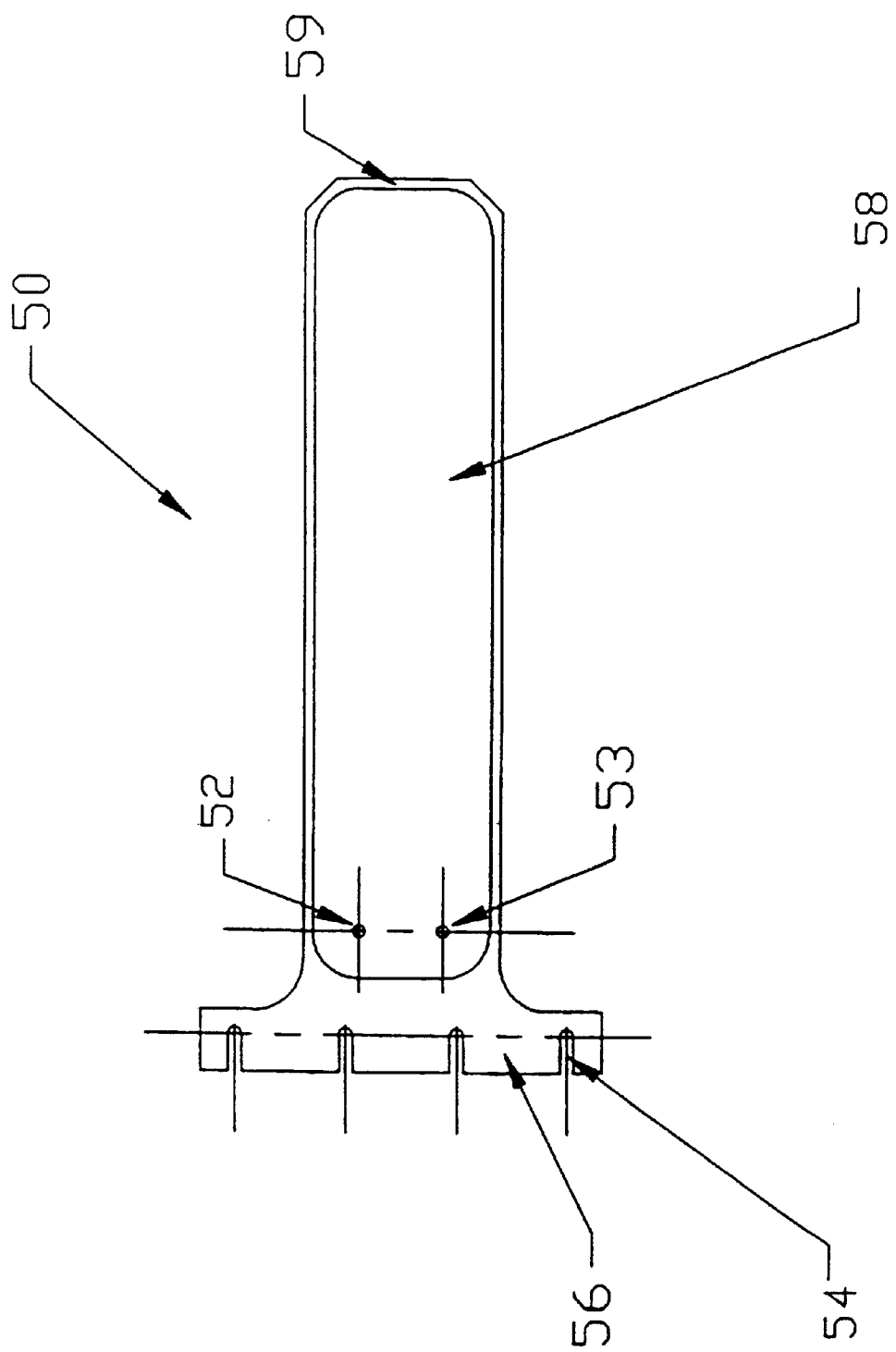
FIG. 6 is a plan view of an embodiment of the holder.
Figure 7:
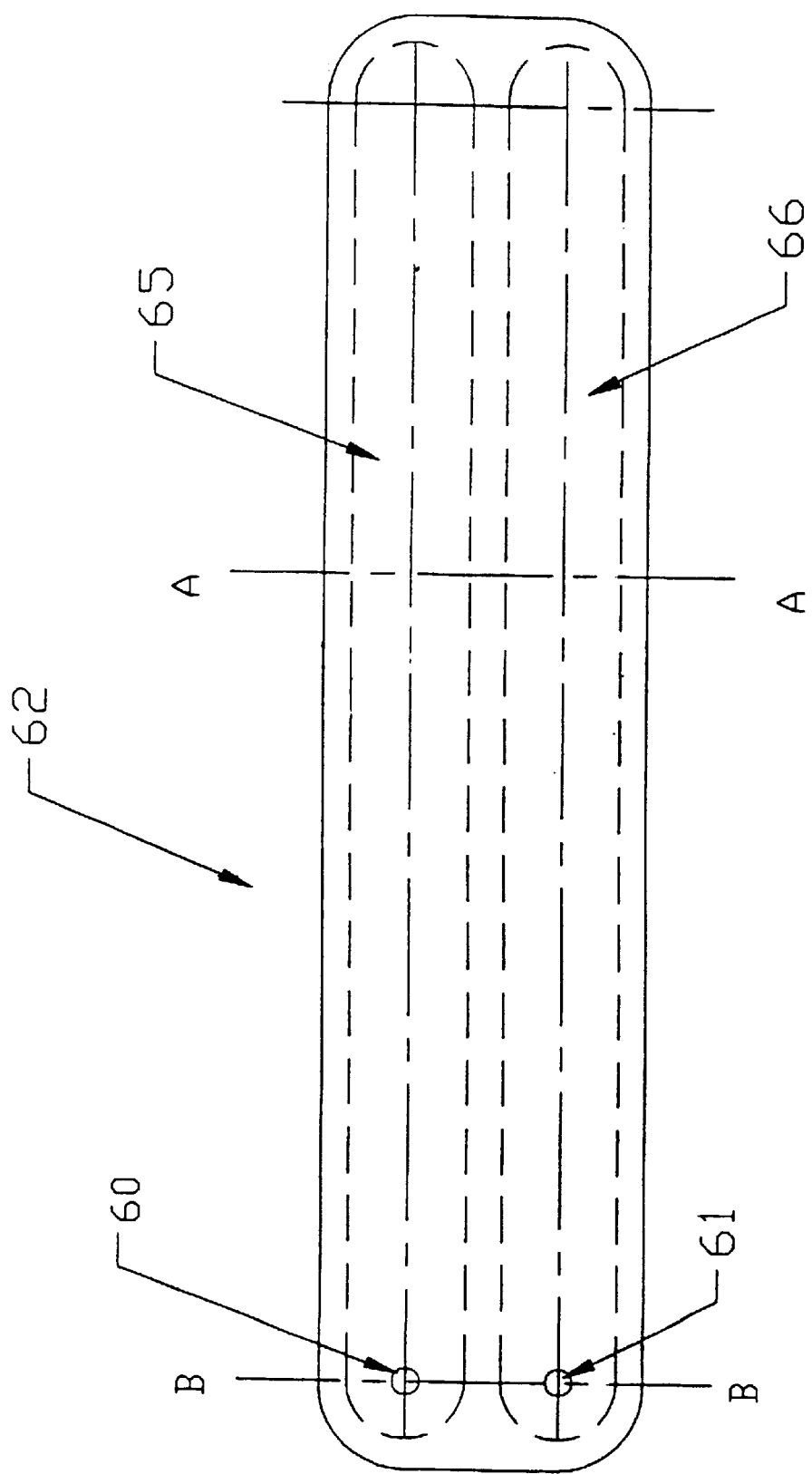
FIG. 7 is a plan view of an embodiment of the electrostatic paddle.
Figure 9:
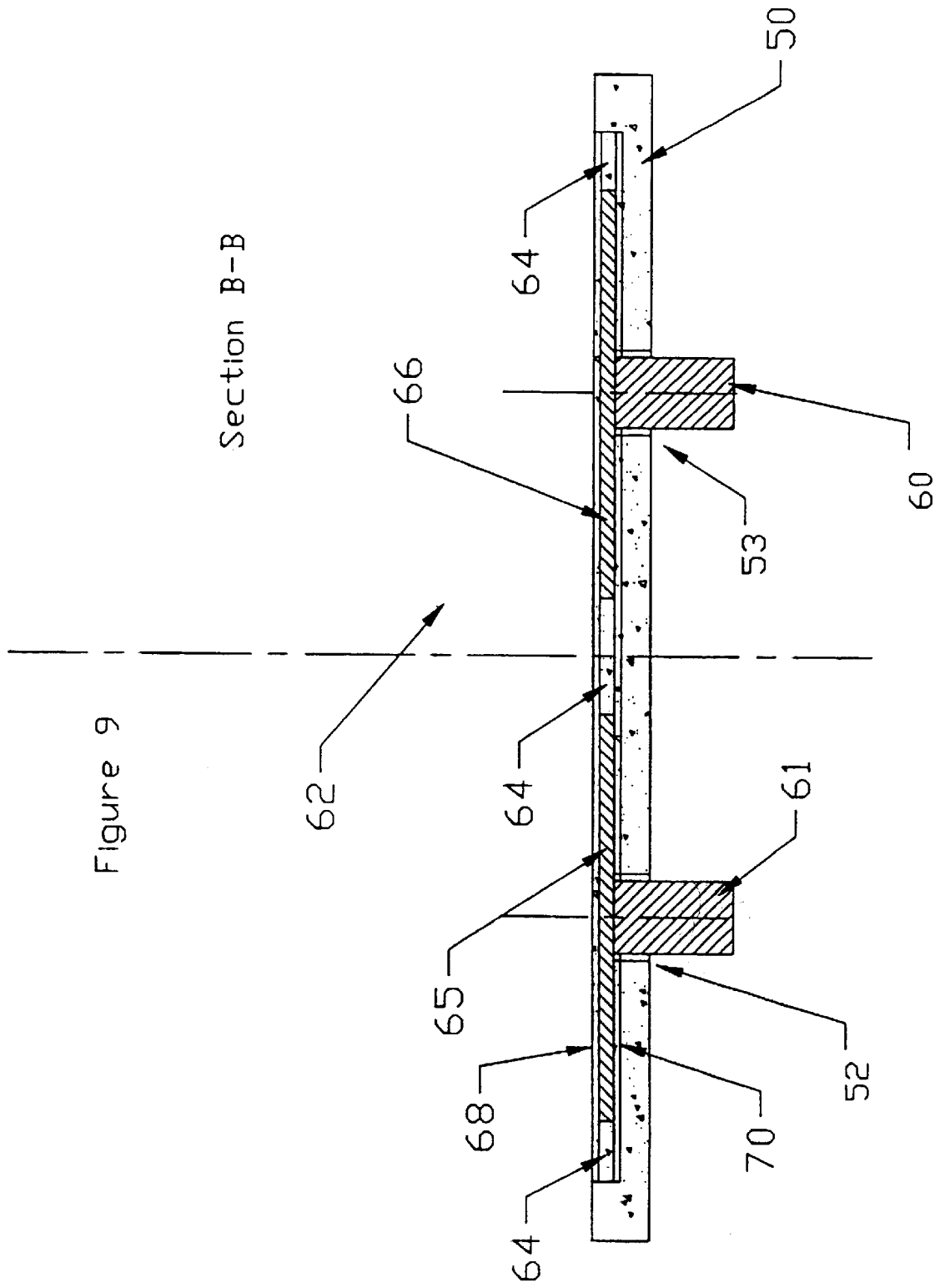
FIG. 9 is a cross-sectional view of the electrostatic paddle within the holder along line B—B in FIG. 7.

FIG. 6 is a plan view of an embodiment of a holder 50. The holder is described in a Semiconductor International article "Sapphire Electrostatic End Effectors For Vacuum Wafer Handlers" (July 1997) which is incorporated herein by reference. The holder 50 is thin and sufficiently rigid to hold an electrostatic paddle 62 as shown in FIG. 7 in a high temperature environment such as 400–500° C. The holder 50 must be thin enough to slip between two semiconductor wafers in a cassette (not shown). One suitable material for high temperature holder 50 is a ceramic such as alumina or quartz. Other suitable materials are metals such as niobium or titanium. As shown in FIG. 6, in the preferred embodiment, the holder 50 includes a recess 58 defined by an outer rim 59 for positioning the paddle 62. The paddle 62 can be attached to the holder 50 by a high temperature vacuum braze using a brazing alloy such as silver, so that the paddle 62 remains in the holder 50 if inverted. The holder 50 includes holes 52, 53 to permit connections to the high voltage studs 60, 61 as shown in FIGS. 7 and 9. The holder 50 also includes a clamp adapter 56 and set of clamp slots 54 to permit the holder 50 to be attached to a wafer transfer mechanism (not shown) in a semiconductor processing reactor (not shown).

FIG. 7 is a plan view of an embodiment of the electrostatic paddle 62. The paddle 62 is a long narrow structure to allow the clamping of a large diameter silicon wafer (not shown) such as an eight-inch wafer to be held during rapid movement. The width of the paddle 62 should be narrow to allow the paddle 62 to slip within the wafer cassette openings (not shown). In a preferred embodiment, the paddle 62 shape matches the recess 58 shown in FIG. 6. In an alternative embodiment, the paddle 62 can be attached to the holder 50 without a recess 58. As shown in FIG. 7, the outlines of two long narrow conductors 65, 66 are indicated by the dotted lines within the outer edge of the paddle 62. The paddle 62 includes studs 60, 61 that permit positive and negative high voltages as discussed earlier to be applied to the conductors 65, 66, respectively.

Figure 8:
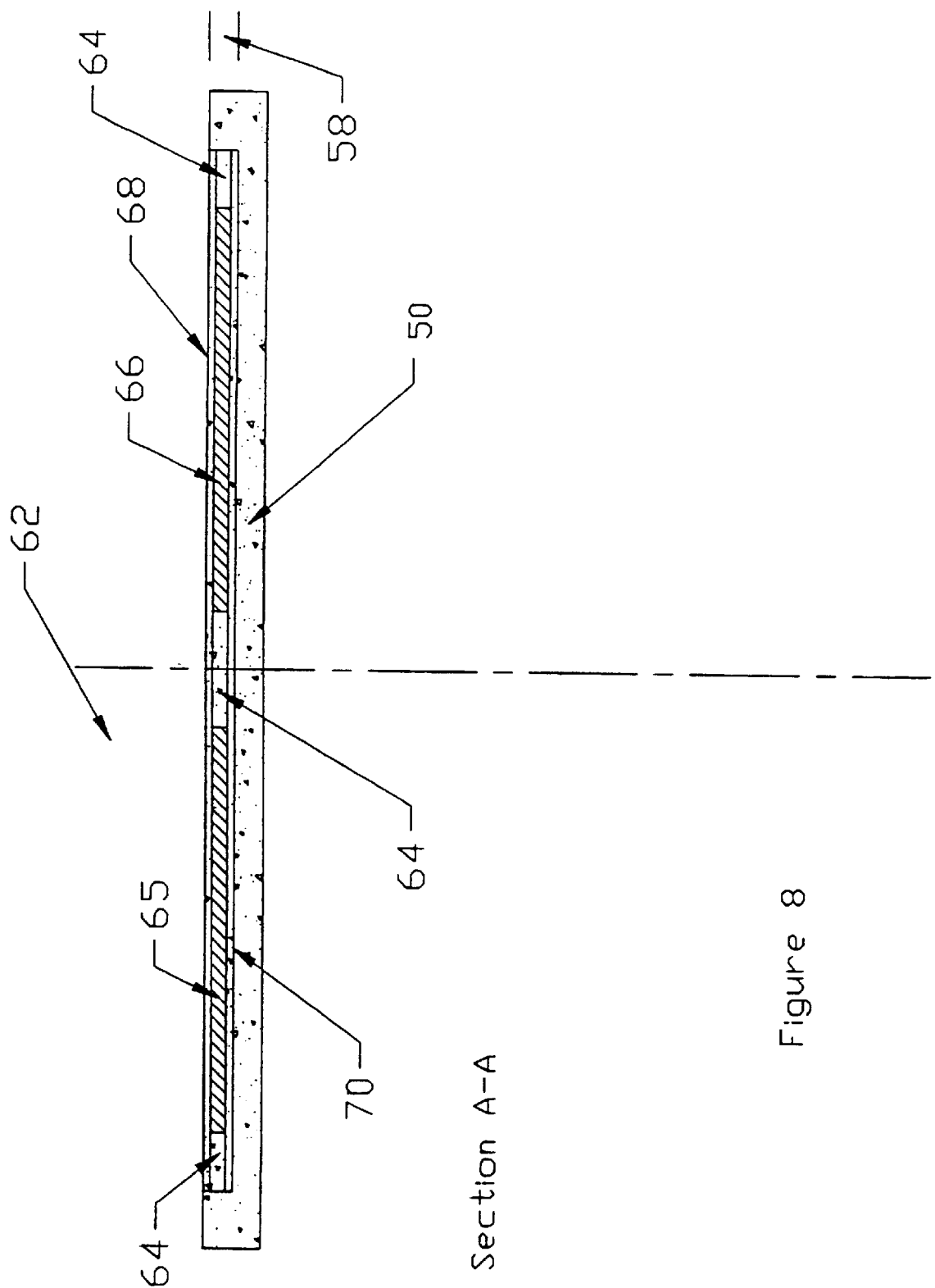
FIG. 8 is a cross-sectional view of the electrostatic paddle within the holder along line A—A in FIG. 7.

FIG. 8 is a cross-sectional view of the electrostatic paddle 62 within the holder 50 along line A—A in FIG. 7. The paddle 62 includes a bottom sapphire plate 70, a top sapphire plate 68, a sapphire frame 64, and two conductors 65, 66, which are all brazed together as earlier discussed. The entire brazed assembly, paddle 62, rests within the recess 58 in the holder 50. The total thickness of the paddle 62 may be about 1/10 inch for wafer cassette handling as discussed earlier.

FIG. 9 is a cross-sectional view of the electrostatic paddle 62 within the holder 50 along line B—B in FIG. 7. The paddle 62 illustrates a cross-section through the holes 52, 53 and through the studs 60 and 61 of the two conductors 65, 66. Again, a cross-sectional view is provided through the bottom sapphire plate 70, the top sapphire plate 68, the sapphire frame 64, and the two conductors 65, 66.

Figure 10:
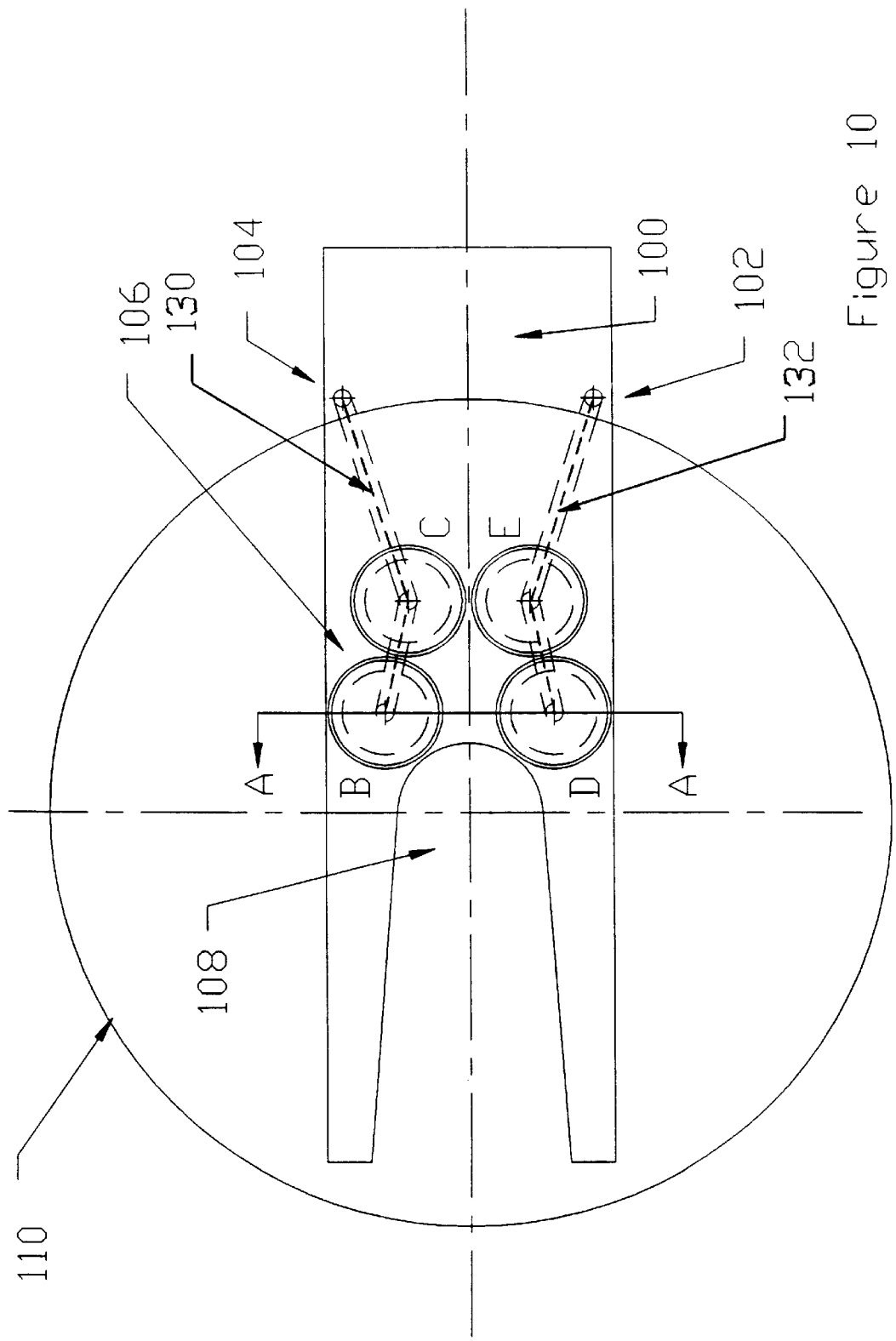
FIG. 10 is a top plan view of an embodiment of the fork holder.

FIG. 10 is a top plan view of a fork style electrostatic end effector. This is an alternative embodiment to the paddle style end effector illustrated in FIGS. 6–9 and is discussed in the Semiconductor International article "Sapphire Electrostatic End Effectors For Vacuum Wafer Handlers" (July 1997), which is incorporated herein by reference. In general, an end effector is the part of a robot arm that supports a semiconductor wafer as it is being moved by the robot. In some instances, the method of removing the wafer from the robot involves placing the wafer on a set of three pins arranged to fit close to the wafer outer radius. For this situation, the end effector has to be narrow enough to clear these pins when placing the wafer on them. The paddle style end effector illustrated in FIGS. 6–9 is intended to be used in this application. In other instances, the method of removing the wafer from the robot involves placing the wafer on a set of three pins arranged to fit within a radius much smaller than the wafer radius. When this is the preferred arrangement, a fork style end effector with an open space 108 shown in FIG. 10 is required and the paddle style end effector cannot be used. The fork style end effector 100 is thin and sufficiently rigid to hold individual electro static buttons B, C, D and E shown in FIG. 10 in a high temperature environment such as 400–500° C. The electrostatic buttons B, C, D, and E may be circular as depicted or any other shape suitable for manufacturing such as discussed earlier.

The fork style end effector 100 must be thin enough to slip between two semiconductor wafers in a cassette (not shown). For example, a typical fork style end effector might need to be as thin as 0.120 inches for 300 mm wafers and 0.090 inches for 200 mm wafers. One suitable material for the fork style end effector holder 100 is a ceramic such as alumina or quartz. Other suitable materials are metals such as aluminum, stainless steel, niobium or titanium.

Figure 11:
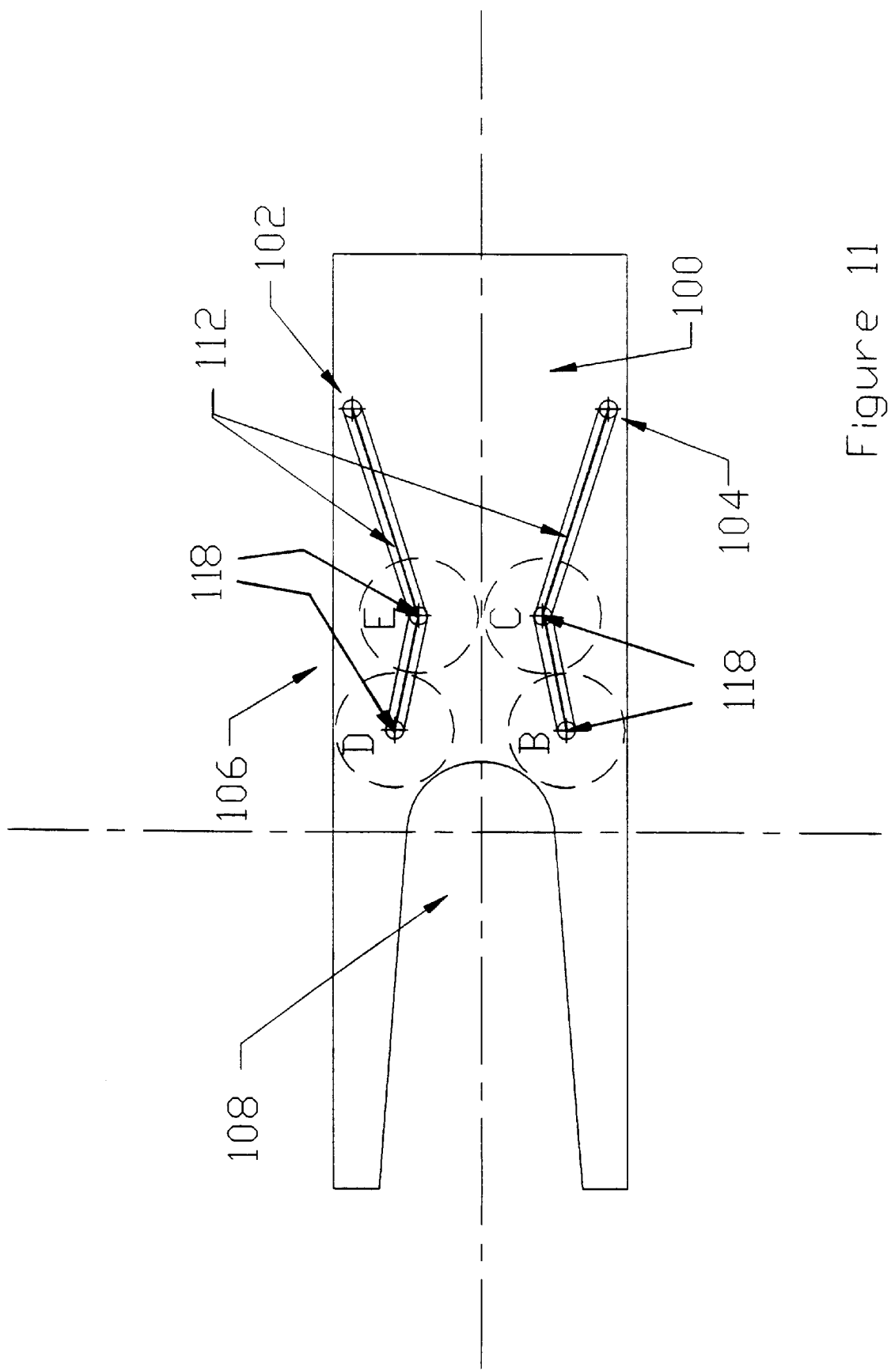
FIG. 11 is a bottom plan view of an embodiment of the fork holder

As shown in FIG. 10, in the preferred embodiment, the fork style end effector 100 includes multiple recesses 106 within which to place the individual electrostatic buttons B, C, D and E. The individual electrostatic buttons B, C, D, and E are constructed in a manner identical to FIGS. 4 and 5 and can be seen more clearly in cross-section in FIG. 12. As is illustrated in FIGS. 10 and 11, the effector 100 includes conductors 130, 132 in grooves 112 to allow electrical contact to each electrostatic button. Also, the depth of each recess 106 is equal to the thickness of the electrostatic buttons, so the top surface of the assembly shown in FIG. 10 is flush. The placement of a typical semiconductor wafer 110 on the effector 100 is also shown.

FIG. 11 is a bottom plan view of a fork style end effector 100. Since the electrostatic buttons B, C, D and E are all electrically isolated, they must be electrically connected to form the electrostatic clamp. A bipolar electrostatic clamp with equal and opposite high voltages can be achieved by conductor 130 connecting buttons B and C together and then to a terminal 104, and then conductor 132 connecting buttons D and E together to a terminal 102. Application of positive and negative high voltages to terminals 102 and 104 activates the electrostatic clamping action. For the fork style end effector 100 shown in FIGS. 10–12, the electrical connections to the electrostatic buttons B, C, D, and E must be within the thickness limitations of the effector 100, since they lie inside the wafer diameter 110 as shown in FIG. 10. Therefore, it is preferable to machine grooves 112 into the bottom of the effector 100 to allow the electrical connections to be made. These grooves 112 extend to the terminals 102 and 104, which are outside the wafer diameter.

Figure 12:
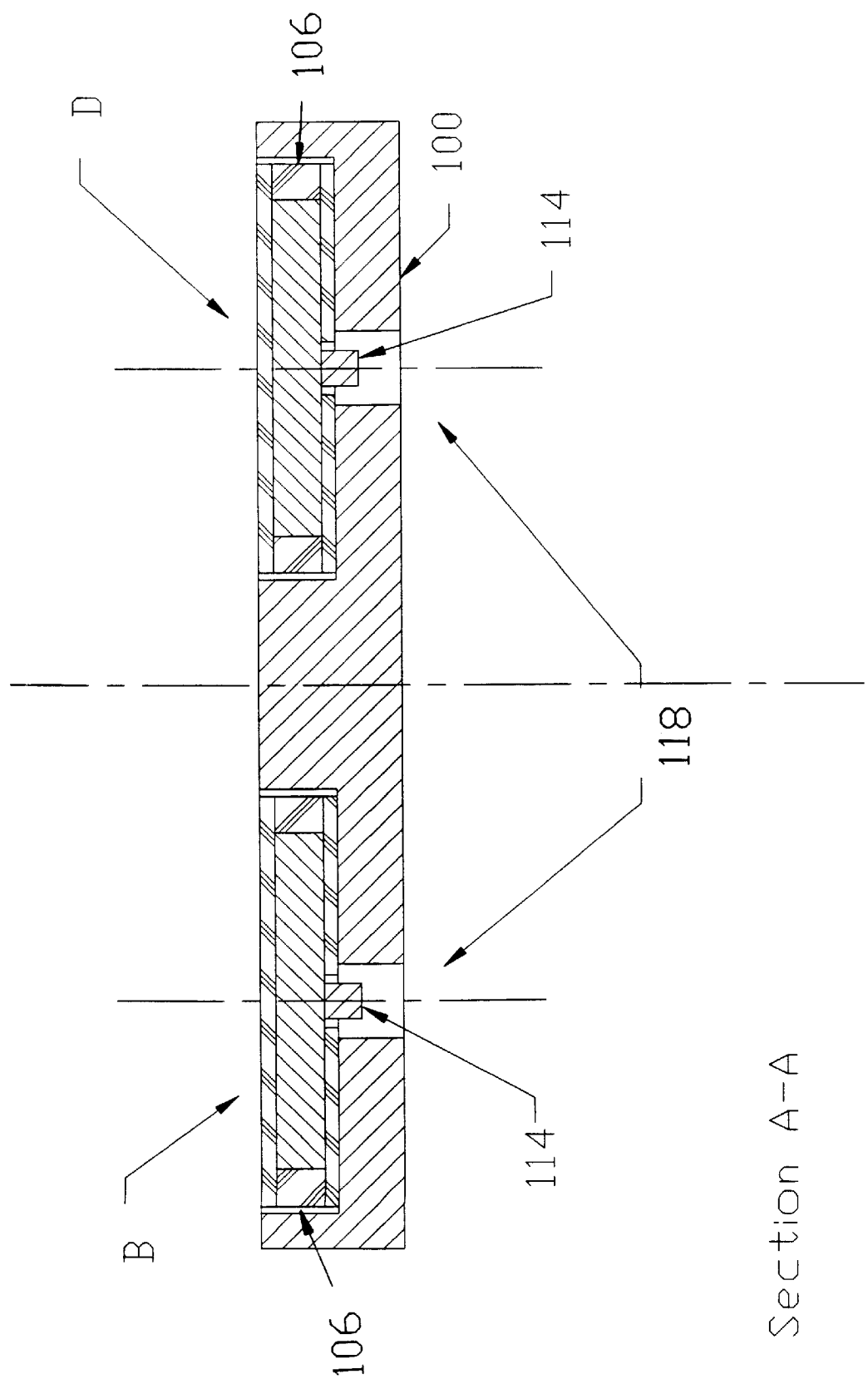
FIG. 12 is a cross-sectional view of the electrostatic elements within the holder along line A—A in FIG. 10.

FIG. 12 is a cross-sectional view of the electrostatic buttons within the effector along line A—A in FIG. 10. In order to maintain the overall thickness of the assembly small enough to allow it to slip between two wafers in a cassette, the studs 114 on each electrostatic button must be short enough to allow any wire attachment to fit within the passages 118. The wire can be attached to each stud by brazing, by welding or by a screw which holds the wire and is threaded into the stud. The studs are preferably niobium. Note that the studs shown in FIG. 12 are much shorter than the studs 60 and 61 in FIG. 9, since the studs for the paddle style end effector can be outside the wafer diameter.

SUMMARY RAMIFICATIONS AND SCOPE

It will be apparent from the preceding that the present invention significantly advances the state of the art in devices for securing wafers in a low pressure environment. In particular, by means of its construction the chuck according to the invention can securely hold a wafer at higher temperatures than was previously possible, and it will do so with extremely inert and high purity materials (i.e. sapphire) at a reasonable cost. In addition, it will allow for the more effective flattening and holding of initially warped wafers. While the invention has been shown and described with reference to preferred embodiments thereof, it will be understood by those skilled in the art that the foregoing and other changes in the form and details may be made therein without departing from the spirit or scope of the invention.

What is claimed is:

1. A fork style electrostatic end effector, comprising:

a holder having a top surface, a bottom surface, a set of tines, and two terminals, wherein the top surface includes a plurality of recesses, the bottom surface includes a plurality of grooves, the holder defines a plurality of passages, each passage extending from one recess to one groove, and each groove extends from at least one passage to one terminal;

a plurality of electrostatic buttons, wherein one of the electrostatic buttons is disposed in a recess; and a plurality of conductors, wherein of the conductors is disposed in one groove and connects one of the electrostatic buttons to one of the terminals.

2. The fork style electrostatic end effector of claim 1, wherein at least one of the plurality of electrostatic buttons comprises a bottom plate with a hole, a conductor plate fixed to the bottom plate, a separator surrounding the conductor plate, and a top plate fixed to conductor plate, wherein the bottom plate, the separator and the top plate are either isotropic sapphire or crystal-aligned anisotropic sapphire.

3. The fork style electrostatic end effector of claim 1, wherein at least one of the electrostatic buttons is disposed in the recess such that the top surface of the one button in the recess is substantially flush with the top surface of the holder and includes a stud residing in the passage, and one conductor disposed in the groove.

4. The fork style electrostatic end effector of claim 1, further comprising means for applying a positive and a negative high voltage to the respective terminals to activate an electrostatic clamping action.

5. The fork style electrostatic end effector of claim 4, wherein the plurality of electrostatic buttons is arranged such that the surface area of the one or more electrostatic buttons connected to the positive voltage is substantially equal to the surface area of the one or more electrostatic buttons connected to the negative voltage.

* * * * *